(12) United States Patent
Liao

(10) Patent No.: US 7,999,389 B2
(45) Date of Patent: Aug. 16, 2011

(54) VIA HOLE STRUCTURE WITH A CONDUCTIVE LAYER FORMED THEREIN

(75) Inventor: Guo-Cheng Liao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 771 days.

(21) Appl. No.: 12/005,331

(22) Filed: Dec. 27, 2007

(65) Prior Publication Data

US 2008/0211107 A1    Sep. 4, 2008

(30) Foreign Application Priority Data

Jan. 3, 2007  (TW) .............................. 96100229 A

(51) Int. Cl.
*H01L 21/44*  (2006.01)
*H01L 23/48*  (2006.01)
(52) U.S. Cl. . 257/774; 257/621; 257/698; 257/E21.476; 257/E23.01
(58) Field of Classification Search .................. 257/621, 257/698, 774, E21.476, E23.01; 438/667
See application file for complete search history.

(56) References Cited

U.S. PATENT DOCUMENTS

2002/0095770 A1 *  7/2002  Ahn et al. ....................... 29/604

* cited by examiner

*Primary Examiner* — Lynne A Gurley
*Assistant Examiner* — Vernon P Webb
(74) *Attorney, Agent, or Firm* — Bacon & Thomas, PLLC

(57) ABSTRACT

A via hole structure and a manufacturing method thereof are provided. The via hole structure is disposed on a substrate. The substrate has a through hole, which passes through the substrate from a top surface to a bottom surface. The via hole structure comprises a conductive layer, several first conductive lines and several second conductive lines. The conductive layer having several conductive sections is disposed on the inner wall of the through hole. The first conductive lines are adjacent to the top surface for connecting the top ends of the conductive sections. The second conductive lines are adjacent to the bottom surface for connecting the bottom ends of the conductive sections. The conductive sections, the first conductive lines and the second conductive lines are serially connected to form a three-dimension layout.

15 Claims, 6 Drawing Sheets

US 7,999,389 B2

VIA HOLE STRUCTURE WITH A CONDUCTIVE LAYER FORMED THEREIN

This application claims the benefit of Taiwan application Serial No. 96100229 filed Jan. 3, 2007, the subject matter of which is incorporated herein by reference.

BACKGROUND OF THE INVENTION

1. Field of the Invention

The invention relates in general to a via hole structure and a manufacturing method thereof, and more particularly to a via hole structure and a manufacturing method thereof applied on the circuit design of the substrate.

2. Description of the Related Art

Printed circuit board (PCB) is an essential part of an electronic product. The PCB is manufactured by forming conductive circuit pattern such as copper foil on the surface or the inside of an insulating base by printing. The key function of the PCB is connecting the circuits of the relevant components.

The early design of printed circuit board is single-sided board. However, due to the restriction on the circuit design of single-sided board, double-sided board and multi-layer board are developed latter on. Double-sided board and multi-layer board have a larger substrate surface more adaptable to complicated circuit design. The paths of substrate are intercommunicated with a via hole passing through various layers so that the distribution of circuit between various substrates is connected thereby embody high density distribution of circuit. As the current electronic products are directed towards powerful functions and design of lightweight, compactness and slimness, the cost and complication of circuit design of the substrate will be reduced if the space utilization of the substrate is improved.

Please Refer to FIG. 1A and FIG. 1B. FIG. 1A is a top view of the inductance circuit design of a conventional printed circuit board. FIG. 1B is a side view of the inductance circuit design of a conventional printed circuit board of FIG. 1A. The conventional printed circuit board inductance circuit device 10 comprises a multi-layer board 11, a spiral inductance 12, and a via hole 13. The via hole 13 is used for connecting the printed circuit boards of a multi-layer board 11. The spiral inductance 12 is disposed on the surface of the multi-layer board 11 for generating inductance effect.

SUMMARY OF THE INVENTION

The invention is directed to a via hole structure and a manufacturing method thereof by using the via hole of a substrate to form a three-dimensional circuit. Such that the space utilization of the substrate is increased, and the cost and design complexity of the substrate circuit are reduced effectively.

According to a first aspect of the present invention, a via hole structure is provided. The via hole structure is disposed on a substrate. The substrate has a through hole, which passes through the substrate from a top surface to a bottom surface. The via hole structure comprises a conductive layer, several first conductive lines and several second conductive lines. The conductive layer having several conductive sections is disposed on the inner wall of the through hole. A plurality of the first conductive lines are adjacent to the top surface for connecting the top ends of the conductive sections. A plurality of the second conductive lines are adjacent to the bottom surface for connecting the bottom ends of the conductive sections. The conductive sections, the first conductive lines and the second conductive lines are serially connected to form a three-dimension layout According to a second aspect of the present invention, a method of manufacturing via hole structure is provided. The via hole structure is formed on a substrate. The substrate has a through hole, which passes through the substrate from a top surface to a bottom surface. The method comprises the following steps of (a) forming several conductive sections on the inner wall of the through hole; (b) filling an insulating layer between the conductive sections; (c) forming through several first conductive lines and several second conductive lines on the insulating layer for respectively connecting the top end and the bottom end of the conductive sections; (d) serially connecting the conductive sections, the first conductive lines and the second conductive lines to form a three-dimensional circuit.

The invention will become apparent from the following detailed description of the preferred but non-limiting embodiments. The following description is made with reference to the accompanying drawings.

DETAILED DESCRIPTION OF THE INVENTION

A via hole structure and a manufacturing method thereof are provided. The via hole structure is formed on the through hole of the substrate. The via hole structure forms a three-dimensional circuit on the via hole by a three-dimensional via hole. The three-dimensional circuit formed according to different methods of manufacturing via holes not only provides inductance effect and resistance effect but also provides super length circuit path. Via hole structures with different internal structures are exemplified below for elaboration but not for limiting the scope of protection of the invention.

First Embodiment

Figure 1A:
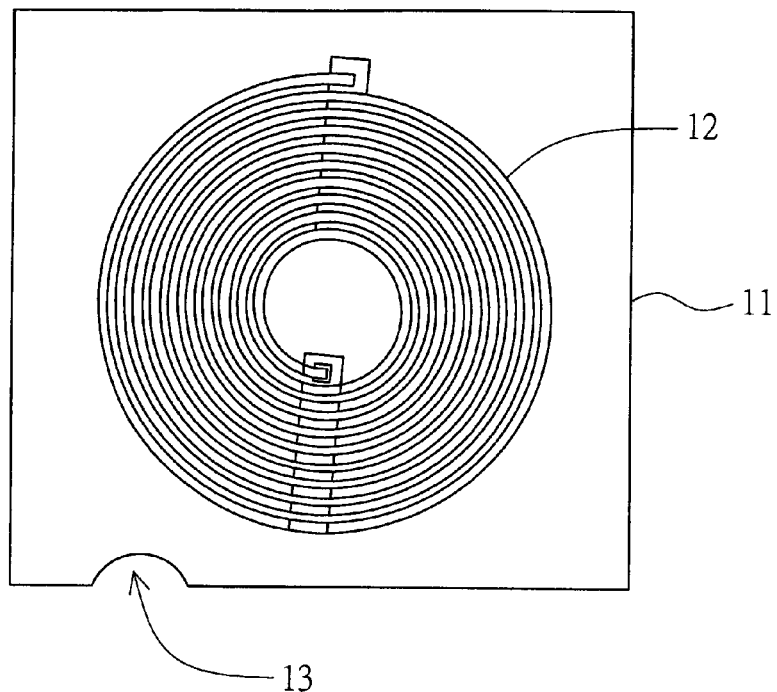
FIG. 1A (Prior Art) is a front view of the inductance circuit design of a conventional printed circuit board.
Figure 1B:
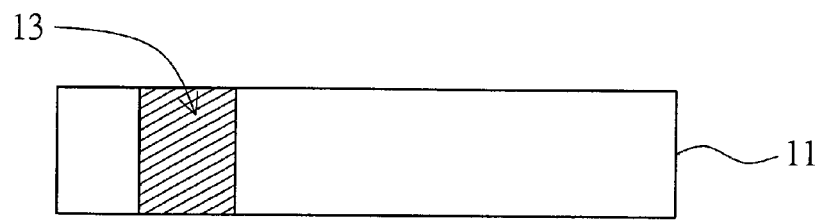
FIG. 1B (Prior Art) is a side view of the inductance circuit design of a conventional printed circuit board of FIG. 1A.
Figure 2:
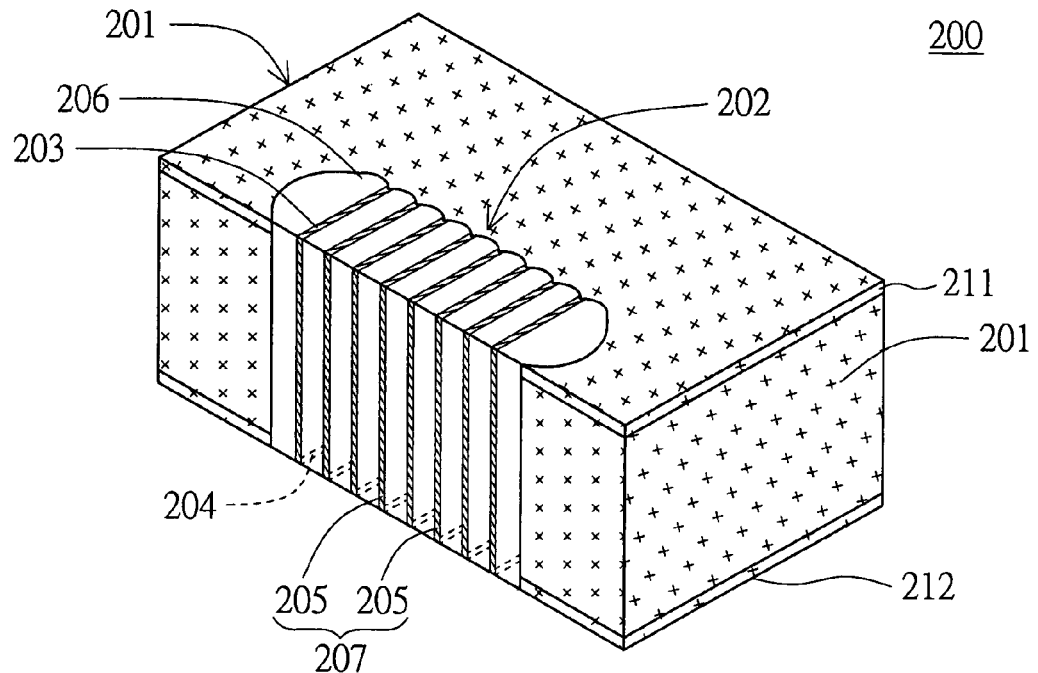
FIG. 2 is a perspective of a via hole structure with inductance effect according to a first embodiment of the invention.

Please refer to FIG. 2. FIG. 2 is a perspective view of a via hole structure with inductance effect according to the first embodiment of the invention. In the present embodiment of the invention, the via hole structure 200 is disposed on a substrate 201. The substrate 201 has a through hole 202, which passes through the substrate from a top surface 211 to a bottom surface 212. The via hole structure 200 comprises a conductive layer 207 and several first conductive lines 203 and second conductive lines 204. The conductive layer 207 disposed on the inner wall of the through hole 202 comprises several conductive sections 205. The first conductive lines 203 are adjacent to the top surface 211 of the substrate 201 for connecting the top ends of the conductive sections 205. The second conductive lines 204 are adjacent to the bottom surface 212 for connecting the bottom ends of the conductive sections 205. The conductive sections 205, the first conductive lines 203 and the second conductive lines 204 are serially connected to form a three-dimension layout.

Figure 3A:
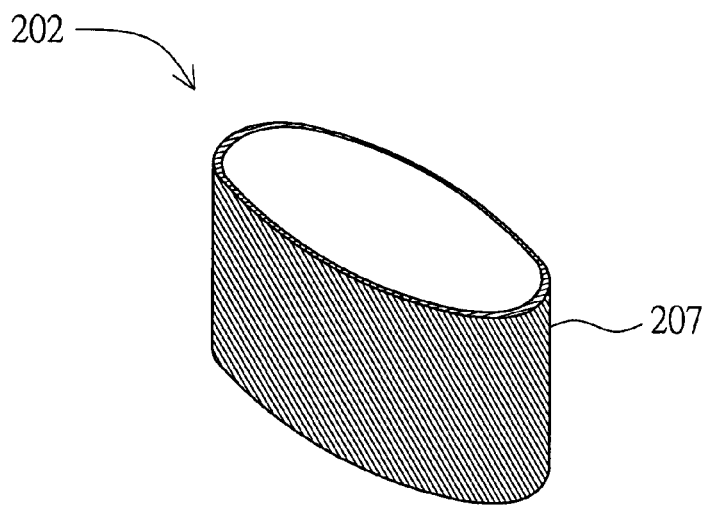
FIG. 3A is a perspective of a conductive layer of the via hole structure of FIG. 2 prior to drilling.
Figure 3B:
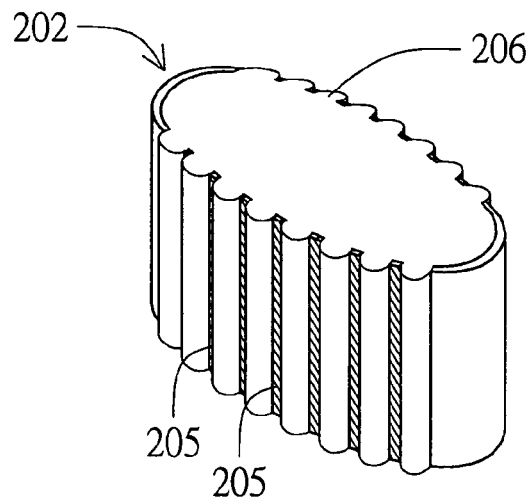
FIG. 3B is a perspective of a conductive layer of the via hole structure of FIG. 2 after drilling.
Figure 6:
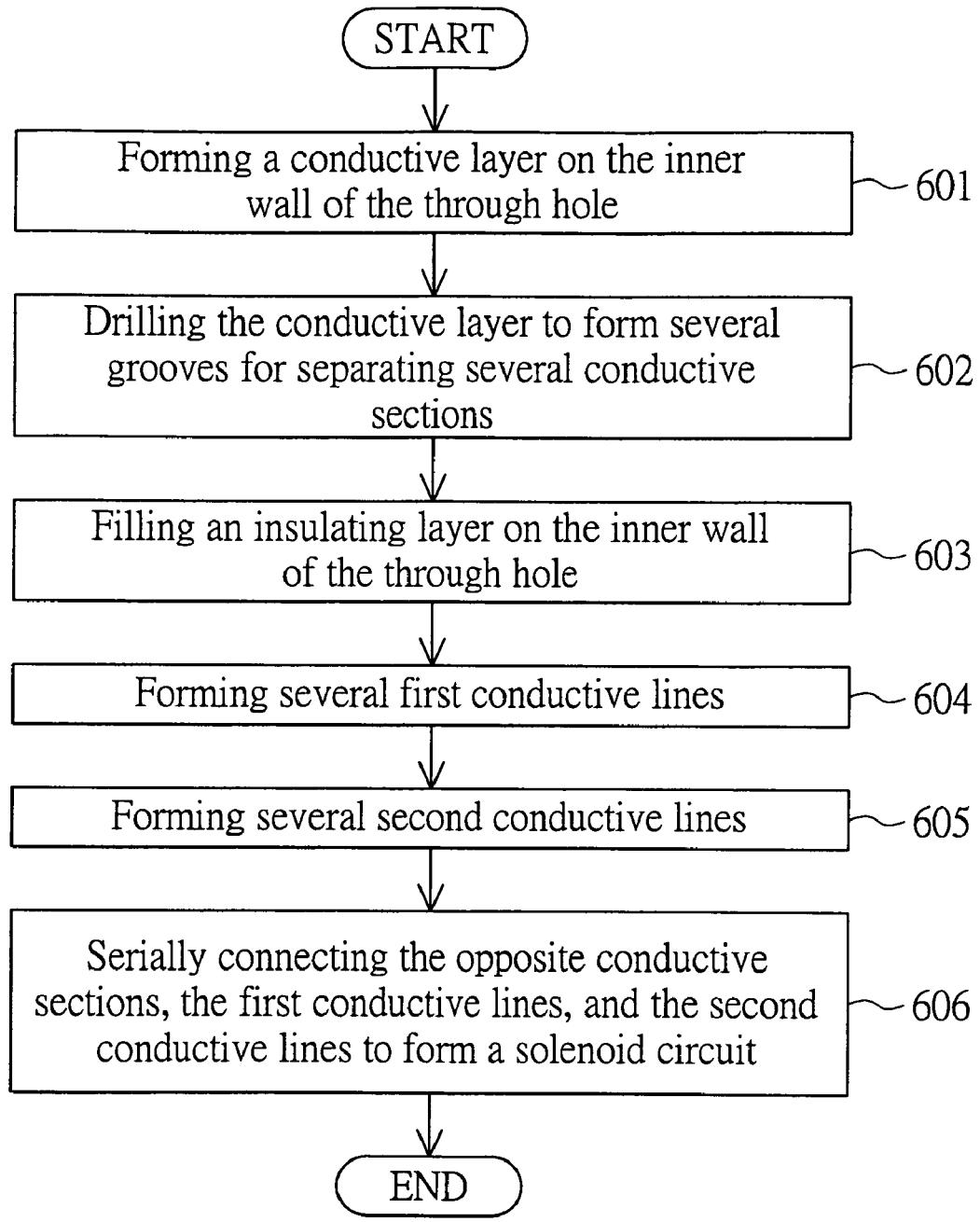
FIG. 6 is a flowchart of a method of manufacturing via hole structure with inductance effect according to a first embodiment of the invention.

Please refer to FIG. 3A, FIG. 3B and FIG. 6. FIG. 3A is a perspective of a conductive layer of the via hole structure of FIG. 2 prior to drilling. FIG. 3B is a perspective of a conductive layer of the via hole structure of FIG. 2 after drilling. FIG. 6 is a flowchart of a method of manufacturing via hole structure with inductance effect according to a first embodiment of the invention. The method begins at step 601 of FIG. 6, a conductive layer 207 is formed on the inner wall of the through hole 202. Next, the method proceeds to step 602, the conductive layer 207 is drilled to form several grooves for separating several conductive sections 205. Then, the method proceeds to step 603, an insulating layer 206 is filled on the inner wall of the through hole 202, so that the insulating layer 206 is filled in the through hole 202 and located between two opposite conductive sections 205.

Figure 4:
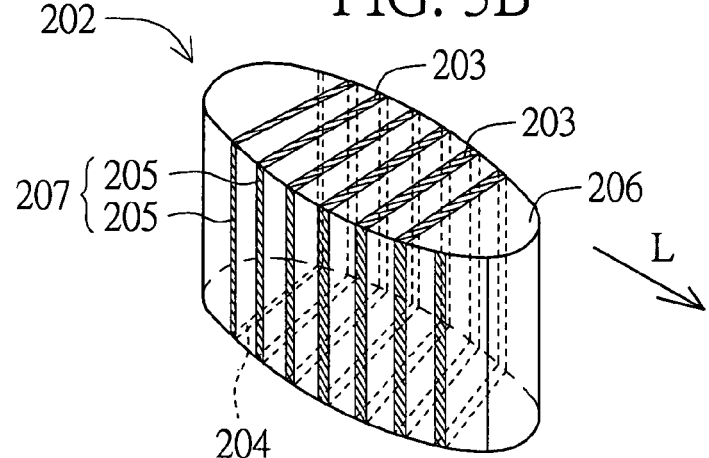
FIG. 4 is a perspective of a design of conductive lines of the via hole structure of FIG. 2.

Please refer to both FIG. 4 and FIG. 6. FIG. 4 is a perspective of a design of conductive lines of the via hole structure of FIG. 2. Afterwards, the method proceeds to step 604, several first conductive lines 203 are formed, wherein the first conductive lines 203 are adjacent to top ends of the conductive sections 205 and disposed on the insulating layer 206. After that, the method proceeds to step 605, several second conductive lines 204 are formed, wherein the second conductive lines 204 are disposed on the insulating layer 205 and adjacent to the bottom ends of the conductive sections 205.

Lastly, the method proceeds to step 606 of FIG. 6, the opposite conductive sections 205, the first conductive lines 203, the second conductive lines 204 are serially connected to form a three-dimensional circuit. The through hole 202 preferably is a strip type through hole 202 having a long axial direction L. The two opposite conductive sections 205, the first conductive lines 203 and the second conductive lines 204 are serially connected spirally along the long axial direction L to form a solenoid circuit, wherein the spiral type circuit spirally winds along the long axial direction L.

Figure 5:
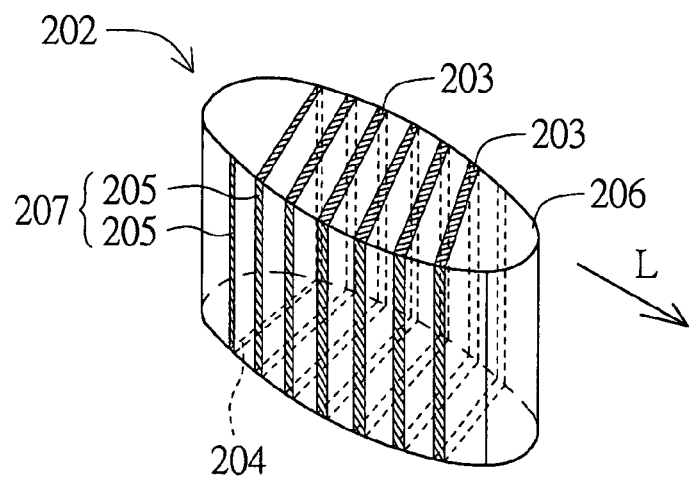
FIG. 5 is another perspective of a design of conductive lines of the via hole structure of FIG. 2.

Please referring to FIG. 5, another perspective of a design of conductive lines of the via hole structure of FIG. 2 is shown. In the step 606 of FIG. 6 of the present embodiment of the invention, the spiral type circuit of FIG. 4 spirally winds along the long axial direction L clockwise, but spiral type circuit of FIG. 5 spirally winds along the long axial direction L counterclockwise. In the present embodiment, the circuit of the solenoid circuit spirally winds to form a coil, and the circuit having inductance effect when turned on is disposed on the through hole to form a three-dimensional circuit, effectively reducing the circuit forming area of the substrate on the printed circuit board and increasing the space utilization of the substrate.

Second Embodiment

Figure 7:
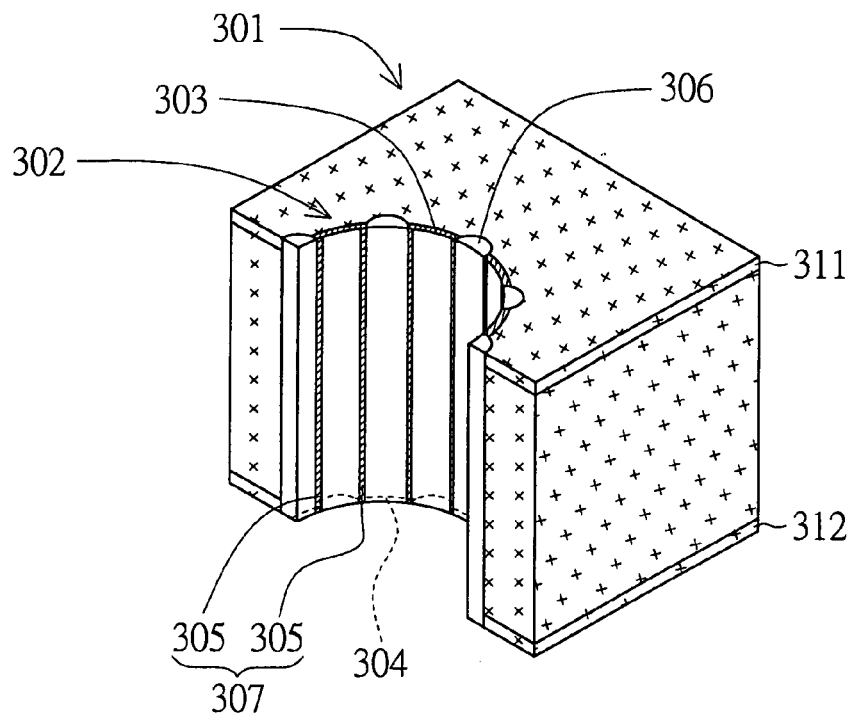
FIG. 7 is a perspective of a via hole structure with resistance effect according to a second embodiment of the invention.

Please refer to FIG. 7. FIG. 7 is a perspective of a via hole structure with resistance effect according to the second embodiment of the invention. The second embodiment and the first embodiment both have a three-dimensional circuit but are different in that the three-dimensional circuit of the via hole structure 200 of the first embodiment generates inductance effect, but the three-dimensional circuit of the via hole structure 300 of the second embodiment generates resistance effect or provides a super long circuit path.

In FIG. 7, the via hole structure 300 of the second embodiment is disposed on a substrate 301. The substrate 301 has a through hole 302, which passes through the substrate 301 from a top surface 311 to a bottom surface 312. The via hole structure 300 comprises a conductive layer 307 and several first conductive lines 303 and several second conductive lines 304. The conductive layer 307 disposed on the inner wall of the through hole 302 comprises several conductive sections 305. The first conductive lines 303 are adjacent to the top surface 311 of the substrate 301 for connecting the top ends of the conductive sections 305. The second conductive lines 304 are adjacent to the bottom surface 312 for connecting the bottom ends of the conductive sections 304. The conductive sections 305, the first conductive lines 303 and the second conductive lines 304 are serially connected to form a three-dimension layout.

Figure 8A:
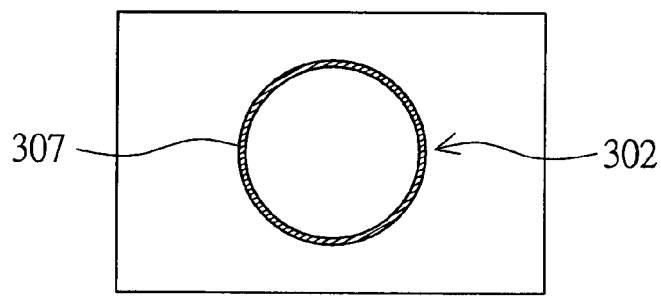
FIG. 8A is a top view of a conductive layer of the via hole structure of FIG. 7 prior to drilling.
Figure 8B:
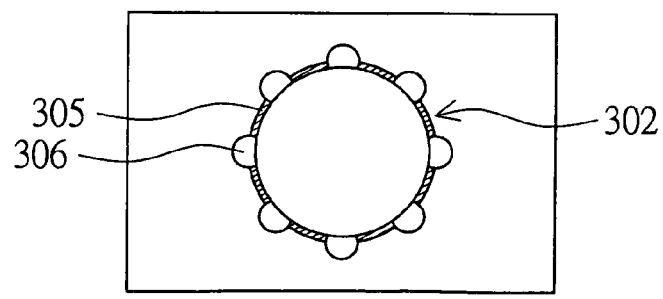
FIG. 8B is a top view of a conductive layer of the via hole structure of FIG. 7 after drilling.
Figure 9:
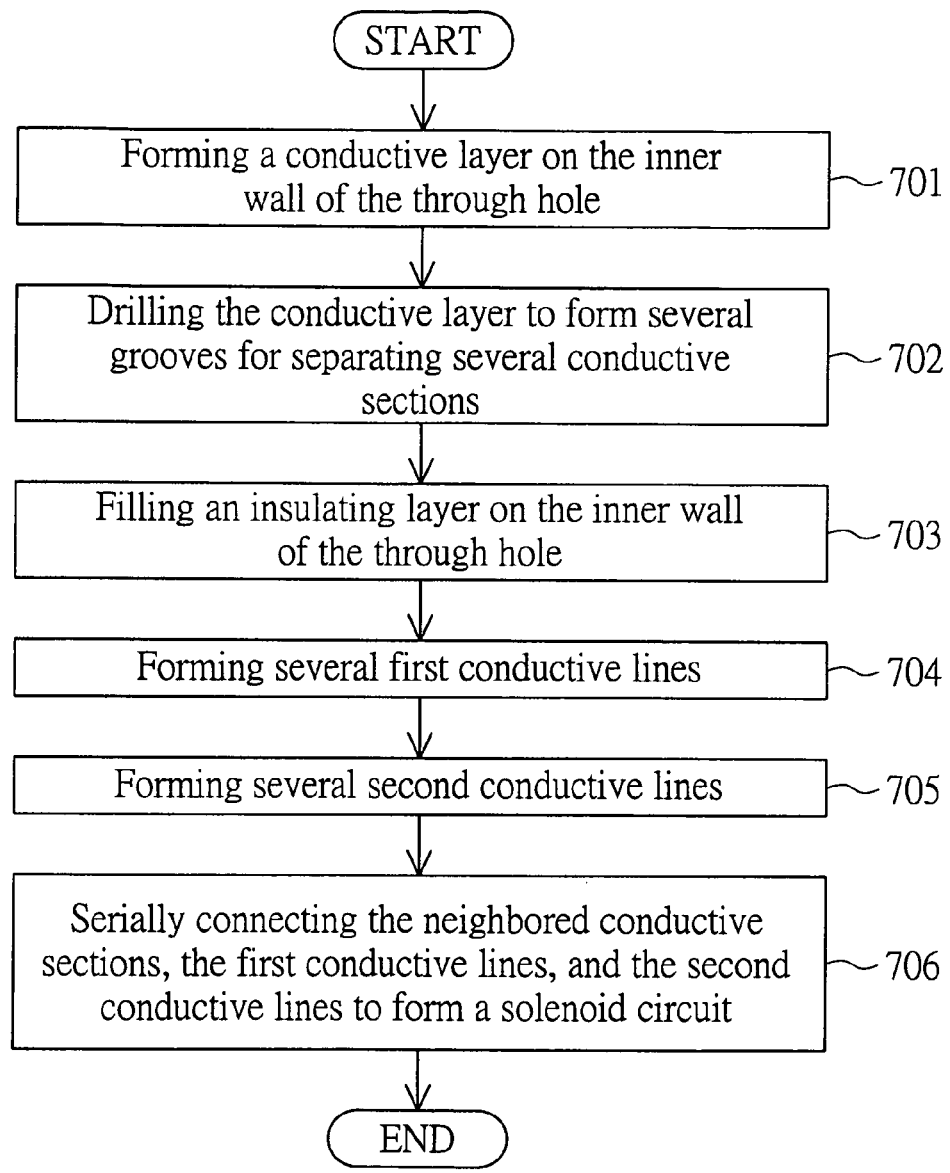
FIG. 9 is a flowchart of a method of manufacturing via hole structure with inductance effect according to a second embodiment of the invention.

Please refer to FIG. 8A, FIG. 8B and FIG. 9. FIG. 8A is a top view of a conductive layer of the via hole structure of FIG. 7 prior to drilling. FIG. 8B is a top view of a conductive layer of the via hole structure of FIG. 7 after drilling. FIG. 9 is a flowchart of a method of manufacturing via hole structure with resistance effect according to a second embodiment of the invention. The method begins at step 701 of FIG. 9, a conductive layer 307 is formed on the inner wall of the through hole 302. Next, the method proceeds to step 702, the conductive layer 307 is drilled to form several grooves for separating the conductive sections 305. Then, the method proceeds to step 703, an insulating layer 306 is filled in the inner wall of the through hole 302, so that the insulating layer 306 is located between two neighboring conductive sections 305.

Afterwards, the method proceeds to step 704 of FIG. 9, several first conductive lines 303 are formed, wherein the first conductive lines 303 are located on the top ends of the conductive sections 305, and disposed on the insulating layer 306. After that, the method proceeds to step 705, several second conductive lines 304 are formed, wherein the second conductive lines 304 are disposed on the insulating layer 305 and located on the bottom ends of the conductive sections 305.

Lastly, the method proceeds to step 706 of FIG. 9, the neighbored conductive sections 305, the first conductive lines 303, the second conductive lines 304 are serially connected to form a three-dimensional circuit. The three-dimensional circuit is a waved circular circuit, comprises several waved circuits arranged around the inner wall of the through hole 302. The waved circular circuit has resistor function or provides a super long circuit path, hence effectively reducing the circuit forming area of the substrate on the printed circuit board and increasing the space utilization of the substrate.

According to the via hole structure and the manufacturing method thereof disclosed in the above embodiments of the invention, the existing through hole of the substrate is used and a three-dimensional circuit is formed on the through hole by a drilling and filling process, hence effectively reducing the circuit forming area of the substrate of the printed circuit board. Different functions are further provided when the connection of the three-dimensional circuit is different. For example, an inductance effect is generated when a solenoid circuit is adopted, and a resistor function or a super long circuit path is provided when a waved circular circuit is adopted.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A via hole structure disposed on a substrate, wherein the substrate has a through hole passing through the substrate from a top surface to a bottom surface, the via hole structure comprising:
   a conductive layer disposed on the inner wall of the through hole, wherein the conductive layer comprises a plurality of conductive sections;
   a plurality of grooves disposed on the inner wall of the through hole and located between two neighboring conductive sections, for separating the conductive sections;
   a plurality of first conductive lines adjacent to the top surface for connecting the top ends of the conductive sections; and
   a plurality of second conductive lines adjacent to the bottom surface for connecting the bottom ends of the conductive sections;
   wherein the conductive sections, the first conductive lines and the second conductive lines are serially connected to form a three-dimension layout.

2. The via hole structure according to claim 1, wherein the top end and the bottom end of each conductive section are respectively connected to the two neighboring conductive sections through the corresponding first conductive line and the corresponding second conductive line.

3. The via hole structure according to claim 1, wherein the via hole structure further comprises:
   an insulating layer filled in the inner wall of the through hole and located between two neighboring conductive sections, wherein the first conductive lines and the second conductive lines are disposed on the insulating layer.

4. The via hole structure according to claim 3, wherein the three-dimension layout comprising a plurality of waved circuit is a waved circular circuit, and the waved circuits are arranged around the inner wall of the through hole.

5. The via hole structure according to claim 4, wherein the through hole is a circular hole.

6. The via hole structure according to claim 4, wherein the via hole structure is a via hole structure with resistance effect.

7. The via hole structure according to claim 1, wherein the via hole structure further comprises:
   an insulating layer filled in the through hole and located between two opposite conductive sections, wherein the first conductive lines and the second conductive lines are disposed on the insulating layer.

8. The via hole structure according to claim 7, wherein the three-dimension layout is a solenoid circuit.

9. The via hole structure according to claim 8, wherein the through hole is a strip hole having a long axial direction, and the solenoid circuit spirally winds along the long axial direction.

10. The via hole structure according to claim 9, wherein the solenoid circuit spirally winds along the long axial direction clockwise.

11. The via hole structure according to claim 9, wherein the solenoid circuit spirally winds along the long axial direction counterclockwise.

12. The via hole structure according to claim 8, wherein the via hole structure is a via hole structure with inductance effect.

13. The via hole structure according to claim 1, wherein the via hole structure further comprises:
   an insulating layer filled in the grooves and located between the two neighboring conductive sections.

14. The via hole structure according to claim 3, wherein the three-dimension layout includes a plurality of U-shaped circuits arranged around the inner wall of the through hole.

15. The via hole structure according to claim 14, wherein the U-shaped circuits are connected to each other.

* * * * *